United States Patent
Mogi et al.

[11] Patent Number: 6,097,159
[45] Date of Patent: Aug. 1, 2000

[54] DRIVE CIRCUIT OF LIGHT EMITTING ELEMENT

[75] Inventors: Takayuki Mogi; Takashi Nishimura, both of Kanagawa, Japan

[73] Assignee: Sony Corporation, Tokyo, Japan

[21] Appl. No.: 09/256,094

[22] Filed: Feb. 24, 1999

[30] Foreign Application Priority Data

Feb. 27, 1998 [JP] Japan .................................. 10-047670

[51] Int. Cl.[7] ........................................................ H01S 3/00
[52] U.S. Cl. ............................ 315/151; 315/149; 372/31; 372/38
[58] Field of Search ..................................... 315/149, 150, 315/151, 159, 307, 308, 291, 200 A, 241 R, 241 S; 372/38, 31

[56] References Cited

U.S. PATENT DOCUMENTS

| | | | |
|---|---|---|---|
| 4,320,964 | 3/1982 | Ishida et al. ............................. | 315/307 |
| 4,998,043 | 3/1991 | Unami et al. ............................ | 315/151 |
| 5,638,390 | 6/1997 | Gilliland et al. .......................... | 372/38 |

*Primary Examiner*—Don Wong
*Assistant Examiner*—Wilson Lee
*Attorney, Agent, or Firm*—Ronald P. Kananen; Rader, Fishman & Grauer

[57] ABSTRACT

A drive circuit of a light emitting element capable of setting a desired constant current and capable of operating stably at a high speed while holding a forward direction voltage required for the emission of light even under a low power supply voltage, wherein there is provided an input circuit which receives differential drive signals and outputs differential signals of levels in accordance with the level of a supplied drive voltage, a differential output circuit in which an emitter-connection portion of transistors is grounded via a resistor, the differential signals and are supplied to bases, and a laser diode is connected to a collector of the transistor, a reference voltage generation circuit which generates a reference voltage, a comparison circuit which compares the voltage of the emitter-connection portion with the reference voltage and outputs a signal of the level in accordance with the result of comparison, and a variable voltage supply circuit which generates a voltage in accordance with the input level of the output signal and supplies the same as the drive voltage of the input circuit.

44 Claims, 5 Drawing Sheets

DRIVE CIRCUIT OF LIGHT EMITTING ELEMENT

BACKGROUND OF THE INVENTION

1. Field of the Invention

The present invention relates to a drive circuit for driving a light emitting element such as a laser diode used in optical communications etc.

2. Description of the Related Art

Figure 1:
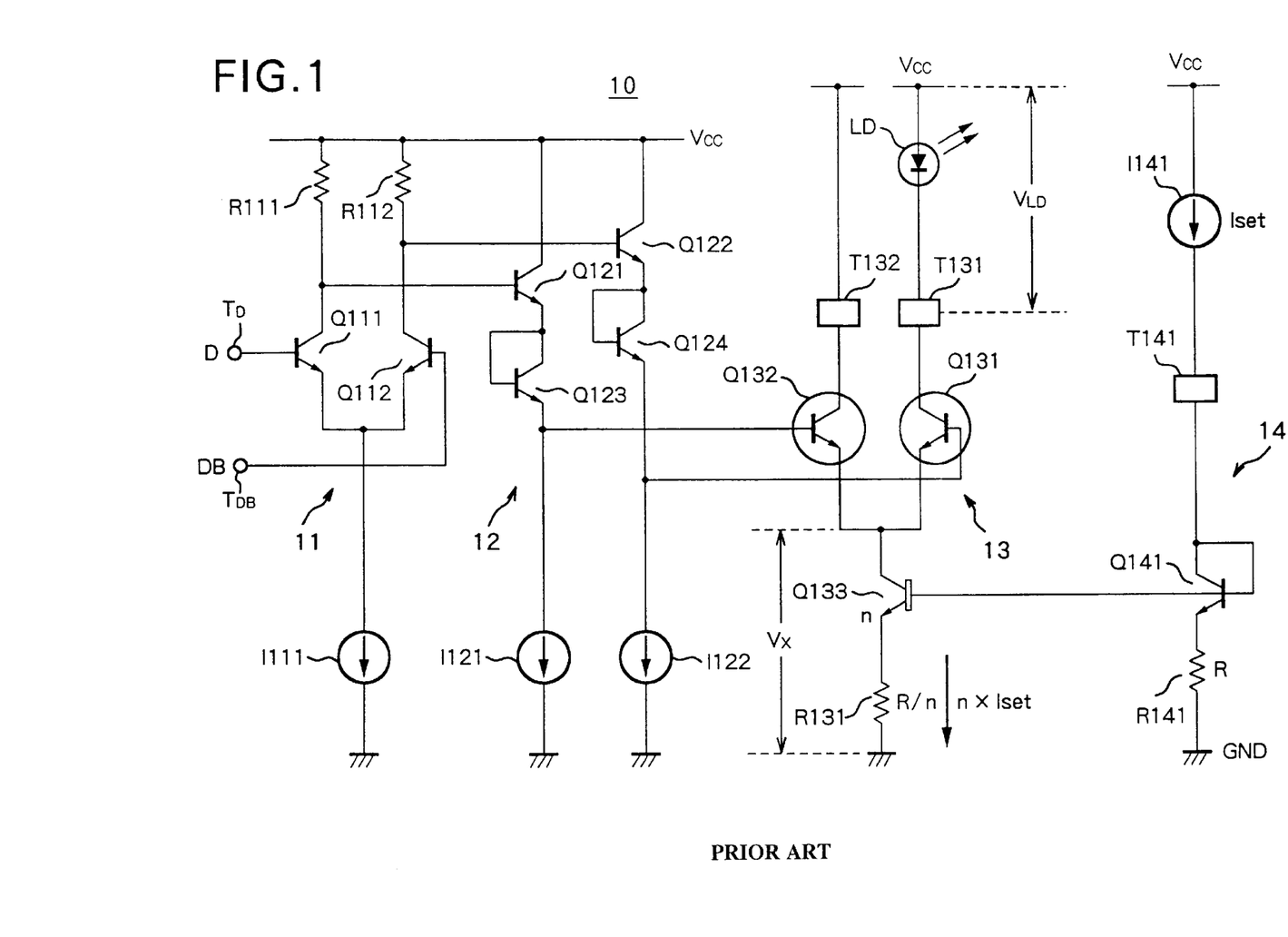
FIG. 1 is a circuit diagram of an example of the configuration of the laser diode use drive circuit of the prior art.

FIG. 1 is a circuit diagram of an example of the configuration of a drive circuit for a laser diode used as a light emitting element of the prior art.

This laser diode use drive circuit 10 is constituted by an input circuit 11, a level shift circuit 12, a differential output circuit 13, and a current setting circuit 14. Further, LD indicates a laser diode.

The input circuit 11 is constituted by npn type transistors Q111 and Q112, resistors R111 and R112, and a current source I111.

Emitters of the transistors Q111 and Q112 are connected to each other, and a connection point of these emitters is connected to the current source I111.

A base of the transistor Q111 is connected to an input terminal TD of a drive signal D, and a collector is connected to a supply line of a power supply voltage $V_{cc}$ via the resistor R111.

The base of the transistor Q112 is connected to an input terminal TDB of a drive signal DB taking a complementary level of the drive signal D, and the collector is connected to the supply line of the power supply voltage $V_{cc}$ via the resistor R112.

The level shift circuit 12 is constituted by npn type transistors Q121, Q122, Q123, and Q124 and current sources I121 and I122.

The base of the transistor Q121 is connected to the collector of the transistor Q111 of the input circuit 11, the collector is connected to the supply line of the power supply voltage $V_{cc}$, and the emitter is connected to the collector and base of the transistor Q123. Namely, the transistor Q123 is diode-connected, and the emitter thereof is connected to the current source I121.

The base of the transistor Q122 is connected to the collector of the transistor Q112 of the input circuit 11, the collector is connected to the supply line of the power supply voltage $V_{cc}$, and the emitter is connected to the collector and base of the transistor Q124. Namely, the transistor Q124 is diode-connected, and the emitter thereof is connected to the current source I122.

The differential output circuit 13 is constituted by npn type transistors Q131, Q132, and Q133 and a resistor R131.

Emitters of the transistors Q131 and Q132 are connected to each other, and the connection point of these emitters is connected to the collector of the transistor Q133 serving as the current source.

The base of the transistor Q131 is connected to the emitter of the transistor Q124 of the level shift circuit 12, and the collector is connected to a (cathode of the) laser diode LD via a connection terminal T131.

The base of the transistor Q132 is connected to the emitter of the transistor Q123 of the level shift circuit 12, and the collector is connected to the supply line of the power supply voltage $V_{cc}$ via a connection terminal T132.

The emitter of the transistor Q133 is grounded via the resistor R131.

The current setting circuit 14 is constituted by an npn type transistor Q141, a resistor R141, and an externally attached current source I141.

The base of the transistor Q141 is connected to the base of the transistor Q133 of the differential output circuit 13 and, at the same time, connected to the collector of the self, and the collector is connected to the current source I141 via a connection terminal T141. The emitter of the transistor Q141 is grounded via the resistor R141.

A so-called current mirror circuit is constituted by the transistor Q141 and the resistor R141 of this current setting circuit 14 and the transistor Q133 and the resistor R131 of the differential output circuit 13.

In this case, for example the transistor size (emitter size) of the transistor Q133 of the differential output circuit 13 is set to n times the transistor size of the transistor Q141 of the current setting circuit 14.

Further, when the resistance value of the resistor R141 of the current setting circuit 14 is defined as R. the resistance value of the resistor R131 of the differential output circuit 13 is set to R/n.

By this, an n x Iset modulation current will be supplied to the differential output circuit 13.

In a state where the modulation current of n times the current Iset by the current source I141 of the current setting circuit 14 is supplied to the differential output circuit 13 in this way, the differential circuit comprising the transistors Q131 and Q132 of the differential output circuit 13 is switched and driven in accordance with the input level of the drive signal D so as to drive the laser diode LD to emit light.

Specifically, when drive signals D and DB are supplied to the input circuit 11 at a high level (H) and a low level (L), respectively, the current flowing in the transistor Q111 side is increased (transistor Q111 becomes ON state) and the current flowing in the transistor Q112 side is reduced (transistor Q112 becomes OFF state).

As a result, the collector current of the transistor Q111 is increased, the transistor Q121 of the level shift circuit 12 becomes the OFF state, and there is a level shift (voltage drop here) at the transistor Q123 serving as the diode. This is supplied to the base of the transistor Q132 of the differential output circuit 13.

At this time, the transistor Q124 of the level shift circuit 12 becomes a high state. This is supplied to the base of the transistor Q131 of the differential output circuit 13.

Accordingly, the current flowing in the transistor Q131 of the differential output circuit 13 is increased (transistor Q131 becomes ON state) and the current flowing in the transistor Q132 side is reduced (transistor Q132 becomes OFF state).

As a result, the laser diode LD emits light.

On the other hand, when drive signals D and DB are supplied to the input circuit 11 at a low level (L) and a high level (H), respectively, the current flowing in the transistor Q112 side is increased (transistor Q112 becomes ON state), and the current flowing in the transistor Q111 side is reduced (transistor Q111 becomes OFF state).

As a result, the collector current of the transistor Q112 is increased, the transistor Q122 of the level shift circuit 12 becomes the OFF state, and the input signal subjected to the amplification action is further shifted in level (voltage drop here) at the transistor Q124 serving as the diode and supplied to the base of the transistor Q131 of the differential output circuit 13.

At this time, the transistor Q123 of the level shift circuit 12 becomes a high state. This is supplied to the base of the transistor Q132 of the differential output circuit 13.

Accordingly, the current flowing in the transistor Q132 of the differential output circuit 13 is increased (transistor Q132 becomes ON state), and the current flowing in the transistor Q131 side is reduced (transistor Q131 becomes OFF state).

As a result, the laser diode LD does not emit light.

As described above, by switching the differential pair of transistors Q131 and Q132 of the differential output circuit 13 in accordance with the input level of the drive signals D and DB, the emission of light by the laser diode LD is controlled.

Along with the demands for reduction in the power consumption in recent years, however, a reduction of the power supply voltage (for example 3.3V) is also being sought for the drive circuit for light emitting elements used in optical communications, etc.

The problem when trying to realize this is the characteristic of the forward direction bias voltage (Vf) at the time of driving possessed by a laser diode or other light emitting element.

This forward direction bias voltage Vf must be as much as 1.8 to 2.0V for obtaining the desired light power over the entire temperature range, but it is difficult to satisfy this characteristic by a 3.3V power source in the drive circuit of the prior art mentioned above.

Namely, as the circuit for setting the modulation current in the drive circuit 10 of the prior art, a current mirror circuit is used as mentioned above, but the voltage ($V_x$) required for the constant current source comprising this current mirror circuit must be as low as about 1.0V (at the time of a low temperature and a large current). The Vf ($V_{LD}$) of the drive transistor (Q131) can only be held at only 1.0V at the most.

Accordingly, in the drive circuit 10 of the prior art, it is impossible to obtain 2.0V for the voltage ($V_{LD}$) to be supplied to the light emitting element when considering the temperature characteristic so far as a current mirror circuit is used.

SUMMARY OF THE INVENTION

An object of the present invention is to provide a drive circuit of a light emitting element capable of setting a desired constant current while holding the forward direction voltage required by the light emitting element even under a low power supply voltage and in addition capable of operating stably at a high speed.

To attain the above object, according to the first aspect of the present invention, there is provided a drive circuit of a light emitting element comprising: a differential output circuit which comprises first and second transistors having a control terminal first and second terminals, and the first terminals connected to each other and a current/voltage conversion element connected between a connection point of first terminals of the first and second transistors and a reference potential, and the second terminal of the second transistor is connected to a power supply voltage source; an input circuit which receives differential drive signals and supplies differential signals in accordance with levels of the supplied drive voltages to the control terminals of the first and second transistors of the differential output circuit; a reference voltage generation circuit which generates a reference voltage; a comparison circuit which compares the potential of the connection point of the first terminals of the first and second transistors of the differential output circuit with the reference voltage and outputs a signal of a level in accordance with the result of comparison; and a variable voltage supply circuit which generates a voltage in accordance with the level of the output signal of the comparison circuit and supplies the same as the drive voltage to the input circuit.

In the present invention, the current/voltage conversion element comprises a resistor.

According to the second aspect of the present invention, there is provided a drive circuit of a light emitting element, comprising: a differential output circuit which comprises first and second transistors having a control terminal and first and second terminals, and the first terminals connected to each other and a current/voltage conversion element connected between a connection point of first terminals of the first and second transistors and a reference potential, and the second terminal of the second transistor is connected to a power supply voltage source; an input circuit which receives differential drive signals and supplies differential signals in accordance with levels of the supplied drive voltages to the control terminals of the first and second transistors of the differential output circuit; a reference voltage generation circuit which generates a reference voltage; a dummy circuit capable of generating a comparison voltage having substantially the same value as the potential of the connection point of the first terminals of the first and second transistors of the differential output circuit upon receipt of the drive voltage; a comparison circuit which compares the comparison voltage generated by the dummy circuit with the reference voltage and outputs a signal of a level in accordance with the result of comparison; and a variable voltage supply circuit which generates a voltage in accordance with the level of the output signal of the comparison circuit and supplies the same as the drive voltage to the input circuit and the dummy circuit.

Further, in the present invention, the dummy circuit comprises a dummy use transistor which has a control terminal and first and second terminals, can adjust the amount of the current flowing between the first and second terminals in accordance with the level of the signal supplied to the control terminal, and the drive voltage is supplied to the control terminal and a current/voltage conversion element connected between the first terminal of the dummy use transistor and the reference potential.

Further, in the present invention, the current/voltage conversion elements of the differential output circuit and the dummy circuit comprise resistors; the resistance value of the resistor of the dummy circuit is set to m (note, m is a natural number) times the resistance value R of the resistor of the differential output circuit; and the size of the dummy use transistor of the dummy circuit is set to 1/m of the size of the first transistor of the differential output circuit.

Further, in the present invention, the reference voltage generation circuit comprises a current source and a resistor connected in series between the power supply voltage source and the reference potential; and the resistance value of this resistor is set to n (note, n is a natural number) times the resistance value R of the resistor serving as the current/voltage conversion element.

Further, the drive circuit of a light emitting element comprises a shut down circuit for making the emission of light of the light emitting element forcibly stop.

The shut down circuit makes the supply of the drive voltage to the input circuit from the variable voltage supply circuit as well stop to make the emission of light of the light emitting element forcibly stop.

According to the third aspect of the present invention, there is provided a drive circuit of a light emitting element comprising: a differential output circuit which comprises first and second transistors having a control terminal and first and second terminals, can adjust the amounts of current flowing between the first and second terminals in accordance with the level of a signal supplied to control terminals, and the first terminals connected to each other and which comprises a current/voltage conversion element connected between a connection point of first terminals of the first and second transistors and a reference potential, and the second terminal of the second transistor is connected to a power supply voltage source; an input circuit which receives differential drive signals and supplies differential signals in accordance with levels of the supplied drive voltages to the control terminals of the first and second transistors of the differential output circuit; a reference voltage generation circuit which generates a reference voltage; a comparison circuit which compares the potential of the connection point of the first terminals of the first and second transistors of the differential output circuit with the reference voltage and outputs a signal of a level in accordance with the result of comparison; and a variable voltage supply circuit which generates a voltage in accordance with the input level of the output signal of the comparison circuit and supplies the same as the drive voltage to the input circuit.

According to the fourth aspect of the present invention, there is provided a drive circuit of a light emitting element, comprising: a differential output circuit which comprises first and second transistors having a control terminal and first and second terminals, can adjust the amounts of current flowing between the first and second terminals in accordance with the level of a signal supplied to control terminals, and the first terminals connected to each other and which comprises a current/voltage conversion element connected between a connection point of first terminals of the first and second transistors and a reference potential, and the second terminal of the second transistor is connected to a power supply voltage source; an input circuit which receives differential drive signals and supplies differential signals in accordance with levels of the supplied drive voltages to the control terminals of the first and second transistors of the differential output circuit; a reference voltage generation circuit which generates a reference voltage; a dummy circuit capable of generating a comparison voltage having substantially the same value as the potential of the connection point of the first terminals of the first and second transistors of the differential output circuit upon receipt of the drive voltage; a comparison circuit which compares the comparison voltage generated by the dummy circuit with the reference voltage and outputs a signal of a level in accordance with the result of comparison; and a variable voltage supply circuit which generates a voltage in accordance with the level of the output signal of the comparison circuit and supplies the same as the drive voltage to the input circuit and the dummy circuit.

According to the fifth aspect of the present invention, there is provided, a light emitting apparatus, comprising: a differential output circuit which comprises first and second transistors having a control terminal and first. and second terminals, and the first terminals connected to each other and a current/voltage conversion element connected between a connection point of first terminals of the first and second transistors and a reference potential, and the second terminal of the second transistor is connected to a power supply voltage source; a light emitting element connected between the second terminal of the first transistor and the power supply voltage source; an input circuit which receives differential drive signals and supplies differential signals in accordance with levels of the supplied drive voltages to the control terminals of the first and second transistors of the differential output circuit; a reference voltage generation circuit which generates a reference voltage; a comparison circuit which compares the potential of the connection point of the first terminals of the first and second transistors of the differential output circuit with the reference voltage and outputs a signal of a level in accordance with the result of comparison; and a variable voltage supply circuit which generates a voltage in accordance with the level of the output signal of the comparison circuit and supplies the same as the drive voltage to the input circuit.

According to the sixth aspect of the present invention, there is provided, a light emitting apparatus, comprising: a differential output circuit which comprises first and second transistors having a control terminal and first and second terminals, and the first terminals connected to each other and a current/voltage conversion element connected between a connection point of first terminals of the first and second transistors and a reference potential, and the second terminal of the second transistor is connected to a power supply voltage source; a light emitting element connected between the second terminal of the first transistor and the power supply voltage source, an input circuit which receives differential drive signals and supplies differential signals in accordance with levels of the supplied drive voltages to the control terminals of the first and second transistors of the differential output circuit; a reference voltage generation circuit which generates a reference voltage; a dummy circuit capable of generating a comparison voltage having substantially the same value as the potential of the connection point of the first terminals of the first and second transistors of the differential output circuit upon receipt of the drive voltage; a comparison circuit which compares the comparison voltage generated by the dummy circuit with the reference voltage and outputs a signal of a level in accordance with the result of comparison; and a variable voltage supply circuit which generates a voltage in accordance with the level of the output signal of the comparison circuit and supplies the same as the drive voltage to the input circuit and the dummy circuit.

According to the seventh aspect of the present invention, there is provided a light emitting apparatus comprising: a differential output circuit which comprising first and second transistors having a control terminal and first and second terminals, can adjust the amounts of current flowing between the first and second terminals in accordance with the level of a signal supplied to control terminals, and the first terminals connected to each other and which comprises a current/voltage conversion element connected between a connection point of first terminals of the first and second transistors and a reference potential, and the second current input/output terminal of the second transistor is connected to a power supply voltage source; a light emitting element connected between the second terminal of the first transistor and the power supply voltage source; an input circuit which receives differential drive signals and supplies differential signals in accordance with levels of the supplied drive voltages to the control terminals of the first and second transistors of the differential output circuit; a reference voltage generation circuit which generates a reference voltage; a comparison circuit which compares the potential of the connection point of the first terminals of the first and second transistors of the differential output circuit with the reference voltage and outputs a signal of a level in accordance with the result of comparison; and a variable voltage supply circuit which generates a voltage in accordance with the input level of the output signal of the comparison circuit and supplies the same as the drive voltage to the input circuit.

According to the eighth aspect of the present invention, there is provided a light emitting apparatus, comprising: a differential output circuit which comprises first and second transistors having a control terminal and first and second terminals, can adjust the amounts of current flowing between the first and second terminals in accordance with the level of a signal supplied to control terminals, and the first terminals connected to each other and which comprises a current/voltage conversion element connected between a connection point of first terminals of the first and second transistors and a reference potential, and the second terminal of the second transistor is connected to a power supply voltage source; a light emitting element connected between the second terminal of the first transistor and the power supply voltage, an input circuit which receives differential drive signals and supplies differential signals in accordance with levels of the supplied drive voltages to the control terminals of the first and second transistors of the differential output circuit; a reference voltage generation circuit which generates a reference voltage; a dummy circuit capable of generating a comparison voltage having substantially the same value as the potential of the connection point of the first terminals of the first and second transistors of the differential output circuit upon receipt of the drive voltage; a comparison circuit which compares the comparison voltage generated by the dummy circuit with the reference voltage and outputs a signal of a level in accordance with the result of comparison; and a variable voltage supply circuit which generates a voltage in accordance with the level of the output signal of the comparison circuit and supplies the same as the drive voltage to the input circuit and the dummy circuit.

According to the present invention, in the reference voltage generation circuit, the reference voltage is generated and supplied to the comparison circuit, and the drive voltage is supplied from the variable voltage supply circuit to the input circuit.

When the differential drive signals are supplied to the input circuit at predetermined levels in this state, they are supplied as the differential signals in accordance with the drive voltages to the control terminals of the first and second transistors of the differential output circuit.

Then, the current flowing in the first transistor is increased, and, as a result, the light emitting element emits light.

At this time, a substantially constant modulation current flows in the current/voltage conversion element, for example, the resistor, connected to the connection portion of the first terminals of the differential output circuit. Accordingly, this modulation current is converted to voltage and supplied to the comparison circuit.

In the comparison circuit, the voltage supplied from the differential output circuit is compared with the reference voltage generated at the reference voltage generation circuit, and a signal of a level in accordance with the result of comparison is output to the variable voltage supply circuit.

In the variable voltage supply circuit, a voltage is generated in accordance with the level of the input signal and supplied as the drive voltage to the input circuit.

Accordingly, for example, the levels of the differential signals supplied from the input circuit to the differential output circuit are adjusted so that the level of the voltage of the connection point of the first current input/output terminals of the differential output circuit becomes low when it is larger than the reference voltage, in other words, is feedback controlled so that the modulation current flowing in the differential output circuit converges to a constant value.

Conversely, when the level of the voltage of the connection point of the first current input/output terminals of the differential output circuit is smaller than the reference voltage, the adjustment is carried out so that the levels of the differential signals supplied from the input circuit to the differential output circuit become high and similarly feedback control is carried out so that the modulation current flowing in the differential output circuit converges to a constant value.

Further, when extinguishing the light, the differential signals are supplied from the input circuit so that the current flowing in the second transistor side of the differential output circuit is increased.

As a result, the light emitting element does not emit light.

Further, according to the present invention, in the reference voltage generation circuit, the reference voltage is generated and supplied to the comparison circuit, and the drive voltage is supplied from the variable voltage supply circuit to the input circuit and the dummy circuit.

When the differential drive signals are supplied to the input circuit at predetermined levels in this state, they are supplied as the differential signals in accordance with the drive voltages to the control terminals of the first and second transistors of the differential output circuit.

Then, the current flowing in the first transistor is increased, and, as a result, the light emitting element emits light.

At this time, in the dummy circuit, a comparison voltage having substantially the same value as the potential of the connection point of the first terminals of the first and second transistors is generated upon receipt of the drive voltage and supplied to the comparison circuit.

In the comparison circuit, the voltage supplied from the dummy circuit is compared with the reference voltage generated at the reference voltage generation circuit, and a signal of a level in accordance with the result of comparison is output to the variable voltage supply circuit.

In the variable voltage supply circuit, a voltage is generated in accordance with the level of the input signal and supplied as the drive voltage to the input circuit.

Accordingly, for example, the levels of the differential signals supplied from the input circuit to the differential output circuit are adjusted so that the level of a comparison voltage by the dummy circuit substantially equal to the voltage of the connection point of the first terminals of the differential output circuit becomes low when it is larger than the reference voltage, in other words, controlled so that the modulation current flowing in the differential output circuit converges to a constant value.

Conversely, when the level of the comparison voltage by the dummy circuit is smaller than the reference voltage, adjustment is carried out so that the levels of the differential signals supplied from the input circuit to the differential output circuit become high and similarly control is carried out so that the modulation current flowing in the differential output circuit converges to a constant value.

BRIEF DESCRIPTION OF THE DRAWINGS

These and other objects and features of the present invention will become clearer from the following description of the preferred embodiments given with reference to the accompanying drawings, in which.

DESCRIPTION OF THE PREFERRED EMBODIMENTS

Below, preferred embodiments will be described with reference to the accompanying drawings.

First Embodiment

Figure 2:
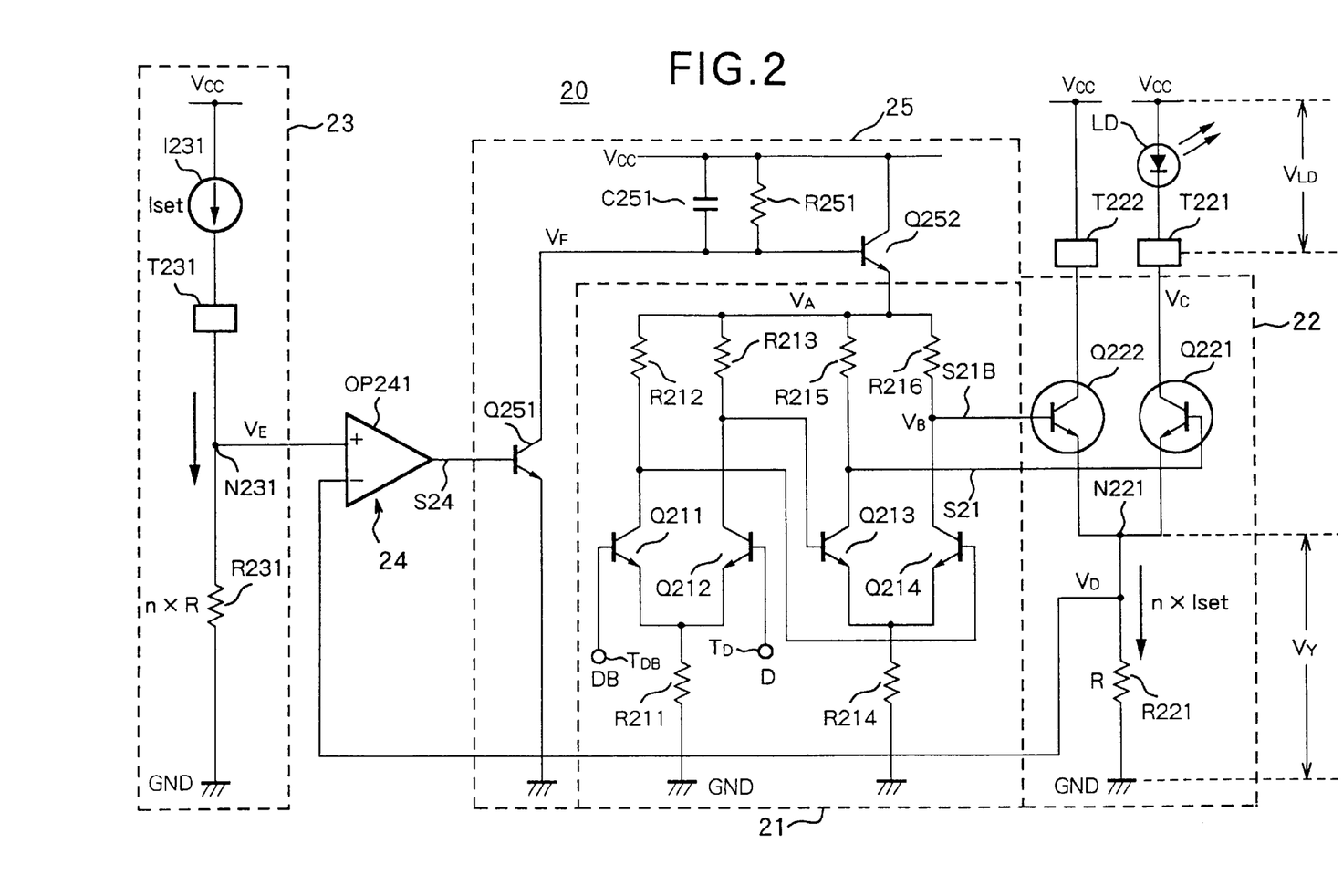
FIG. 2 is a circuit diagram of a first embodiment of a laser diode use drive circuit according to the present invention.

FIG. 2 is a circuit diagram of a first embodiment of a laser diode use drive circuit according to the present invention.

This laser diode use drive circuit 20 is constituted by, as shown in FIG. 2, an input circuit 21, a differential output circuit 22, a reference voltage generation circuit 23, a comparison circuit 24, and a constant current setting use variable voltage supply circuit 25.

The input circuit 21 is constituted by npn type transistors Q211 to Q214 and resistors R211 to R216, receives the differential drive signals D and DB, and supplies differential signals S21 and S21B in accordance with the level of the drive voltage VA supplied from the variable voltage supply circuit 25 to the differential output circuit 22.

Emitters of the transistors Q211 and Q212 are connected to each other, and the connection point of these emitters is grounded via the resistor R211.

The base of the transistor Q212 is connected to the input terminal TD of the drive signal D, and the collector is connected to the voltage supply line (emitter of the transistor Q252) of the variable voltage supply circuit 25 via the resistor R213.

The base of the transistor Q211 is connected to the input terminal TDB of the drive signal DB taking a complementary level of the drive signal D, and the collector is connected to the voltage supply line of the variable voltage supply circuit 25 via the resistor R212.

Emitters of the transistors Q213 and Q214 are connected to each other, and the connection point of these emitters is grounded via the resistor R214.

The base of the transistor Q213 is connected to the collector of the transistor Q212, and the collector is connected to the voltage supply line of the variable voltage supply circuit 25 via the resistor R215.

The base of the transistor Q214 is connected to the collector of the transistor Q211, and the collector is connected to the voltage supply line of the variable voltage supply circuit 25 via the resistor R216.

The differential output circuit 22 is constituted by npn type transistors Q221 and Q222 and a resistor R221 having the resistance value R serving as the current/voltage conversion element. Receiving the differential signals S21 and S21B from the input circuit 21, the differential circuit switches and adjusts the amount of supply of the current to the laser diode LD to drives the same to emit light.

Emitters of the transistors Q211 and Q222 are connected to each other, and the connection point of these emitters is grounded via the resistor R221.

The base of the transistor Q221 is connected to the collector of the transistor Q213 of the input circuit 21, and the collector is connected to the (cathode of the) laser diode LD via a connection terminal T221.

The base of the transistor Q222 is connected to the collector of the transistor Q214 of the input circuit 21, and the collector is connected to the supply line of the power supply voltage $V_{cc}$ via a connection terminal T222.

The reference voltage generation circuit 23 is constituted by an externally attached current source I231 and a resistor R231 with a resistance value set to n×R, that is, n times the resistance value R of the resistor R221 of the differential output circuit 22. It generates the reference voltage VE (=Iset×(n×R)) and supplies the same to the comparison circuit 24.

One end of the resistor R231 is connected via a connection terminal T231 to the current source I231, and the connection point (node) N231 thereof is connected to one input of the comparison circuit 24. The other end of the resistor R231 is grounded.

The comparison circuit 24 is constituted by an operational amplifier OP241, compares the voltage VD of the emitter-connection portion N221 of the differential output circuit 22 with the reference voltage VE generated at the reference voltage generation circuit 23, and outputs a signal S24 of a level in accordance with the result of comparison to the variable voltage supply circuit 25.

The inverted input (−) of the operational amplifier OP241 is connected to the node N231 of the reference voltage generation circuit 23, and a non-inverted input (+) is connected to the emitter-connection portion N221 of the differential output circuit 22.

The variable voltage supply circuit 25 is constituted by npn type transistors Q251 and Q252, a resistor R251, and a phase compensation use capacitor C251 and supplies a voltage VF in accordance with the input level of an output signal S24 of the comparison circuit 24 as the drive voltage VA of the input circuit 21. In actuality, the supply voltage becomes a voltage (VF−Vf) down from the voltage VF by an amount of the forward direction bias Vf of the transistor Q252.

The base of the transistor Q251 is connected to the output of the operational amplifier OP241 serving as the comparison circuit 24, the emitter is grounded, and the collector is connected to the base of the transistor Q252 and, at the same time, connected to the supply line of the power supply voltage $V_{cc}$ via the resistor R251 and connected to one electrode of the capacitor C251. The other electrode of the capacitor C251 is connected to the supply line of the power supply voltage $V_{cc}$.

The collector of the transistor Q252 is connected to the supply line of the power supply voltage $V_{cc}$, and the emitter is connected to load use resistors R212, R213, R215, and R216 of the input circuit 21.

Next, an explanation will be made of the operation by the above configuration.

In an initial state, in the reference voltage generation circuit 23, a reference voltage such as VE (=Iset×(n×R)) is generated and supplied to the comparison circuit 24, and a drive voltage such as VA is supplied from the variable voltage supply circuit 25 to the input circuit 21.

In this state, when for example drive signals D and DB are supplied to the input circuit 21 at a high level (H) and a low level (L), respectively, the current flowing in the transistor Q212 side is increased (transistor Q212 becomes ON state), and the current flowing in the transistor Q211 side is reduced (transistor Q211 becomes OFF state).

As a result, the collector current of the transistor Q212 is increased, the transistor Q213 constituting the differential amplifier circuit of the latter stage becomes the OFF state, and an input signal receiving the amplification action is supplied to the base of the transistor Q221 of the differential output circuit 22 as the differential signal S21 of the level VB.

At this time, the transistor Q214 constituting the differential amplifier circuit of the latter stage of the input circuit 21 is held in an ON state, and the differential signal S21B is supplied at a low level to the base of the transistor Q222 of the differential output circuit 22.

By this, the current flowing in the transistor Q221 of the differential output circuit 22 is increased (transistor Q221 becomes ON state), and the current flowing in the transistor Q222 side is reduced (transistor Q222 becomes OFF state).

As a result, the laser diode LD emits light.

At this time, a modulation current such as substantially Iset×N flows in the resistor R221 connected to the emitter-connection portion side of the differential circuit. Accordingly, the potential VD of the emitter-connection portion N221 becomes substantially Iset×n×R. This voltage VD is supplied (fed back) to the non-inverted input (+) of the operational amplifier OP241 serving as the comparison circuit 24.

In the comparison circuit 24, the voltage VD of the emitter-connection portion N221 of the differential output circuit 22 and the reference voltage VE generated at the reference voltage generation circuit 23 are compared, and a signal S24 of a level in accordance with the result of comparison is output to the variable voltage supply circuit 25. Specifically, when the voltage VD of the emitter-connection portion N221 is larger than the reference voltage VE, the level of the signal S24 is raised, while when it is smaller than the latter, the level of the signal S24 is lowered before output.

In the variable voltage supply circuit 25, the amount of the current flowing in the transistor Q251 is adjusted in accordance with the level of the input signal S24, and a voltage VF determined by this variable current and the resistance value of the resistor R251 is generated.

This voltage VF is supplied to the input circuit 21 as the drive voltage VA through the transistor Q252. In actuality, the supply voltage becomes a voltage reduced from the voltage VF by an amount of the forward direction bias Vf of the transistor Q252 (VF−Vf).

Accordingly, the levels of the differential signals S21 and S21B supplied from the input circuit 21 to the differential output circuit 22 are adjusted so that the level of the voltage VD of the emitter-connection portion N221 of the differential output circuit 22 becomes low when it is larger than the reference voltage VE, in other words, controlled so that the modulation current flowing in the differential output circuit 22 converges to n×Iset.

Conversely, when the level of the voltage VD of the emitter-connection portion N221 of the differential output circuit 22 is smaller than the reference voltage VE, adjustment is carried out so that levels of the differential signals S21 and S21B supplied from the input circuit 21 to the differential output circuit 22 become high and similarly feedback control is carried out so that the modulation current flowing in the differential output circuit 22 converges to n×Iset.

On the other hand, when drive signals D and DB are supplied to the input circuit 21 at a low level (L) and high level (H), respectively, the current flowing in the transistor Q211 side is increased (transistor Q211 becomes ON state), and the current flowing in the transistor Q212 side is reduced (transistor Q212 becomes OFF state).

As a result, the collector current of the transistor Q211 is increased, the transistor Q214 constituting the differential amplifier circuit of the latter stage becomes the OFF state, and an input signal receiving an amplification action is supplied to the base of the transistor Q222 of the differential output circuit 22 as the differential signal S21B of the level VB.

At this time, the transistor Q213 constituting the differential amplifier circuit of the latter stage of the input circuit 21 is held in the ON state, and the differential signal S21 is supplied at a low level to the base of the transistor Q221 of the differential output circuit 22.

By this, the current flowing in the transistor Q222 of the differential output circuit 22 is increased (transistor Q222 becomes ON state), and the current flowing in the transistor Q221 side is reduced (transistor Q221 becomes OFF state).

As a result, the laser diode LD does not emit light.

In this case as well, feedback control of the modulation current is carried out as mentioned above.

By performing the switching and driving of the differential circuit comprising the transistors Q221 and Q222 of the differential output circuit 22 in accordance with the input levels of the drive signals D and DB in a state where feedback control is carried out so that the modulation current of n times the current Iset of the current source I231 of the reference voltage generation circuit 23 is supplied to the differential output circuit 22 in this way, the laser diode LD is driven to emit light.

As explained above, according to the present first embodiment, since by providing the input circuit 21 which receives the differential drive signals D and DB and outputs the differential signals S21 and S21B of levels in accordance with the level of the drive voltage VA supplied from the variable voltage supply circuit 25; a differential output circuit 22 in which emitters of the transistors Q221 and Q222 are connected to each other, the emitter-connection portion N221 of them is grounded via the resistor R221 having a resistance value of R, the differential signals S21 and S21B are supplied to bases, and the laser diode LD is connected to the collector of the transistor Q221; the reference voltage generation circuit 23 which generates the reference voltage VE such as Iset×n×R; the comparison circuit 24 which compares the voltage VD of the emitter-connection portion N221 of the differential output circuit 22 and the reference voltage VE generated at the reference voltage generation circuit 23 and outputs the signal S24 of the level in accordance with the result of comparison; and the variable voltage supply circuit 25 which generates the voltage VF in accordance with the input level of the output signal S24 of the comparison circuit 24 and supplies the same as the drive voltage VA of the input circuit 21 and since feedback control is carried out so that the reference voltage VE and the voltage VD of the emitter-connection portion N221 of the differential output circuit 22 become equal, the transistor for the constant current source of the current mirror circuit becomes unnecessary, saturation does not occur even when setting a large modulation current, and the desired constant current (modulation current) can be set while holding the forward direction voltage required by the light emitting element even under a low power supply voltage (3.3V).

Further, by setting the resistance value R of the resistor R221 and voltage VY of the two ends thereof at adequate values, a wide output voltage range (VLD>2V) can be obtained even under a low power supply voltage (3.3V).

Further, since the laser diode LD is driven by a differential circuit of transistors, so there is an advantage that a high speed and stable operation can be realized.

Second Embodiment

Figure 3:
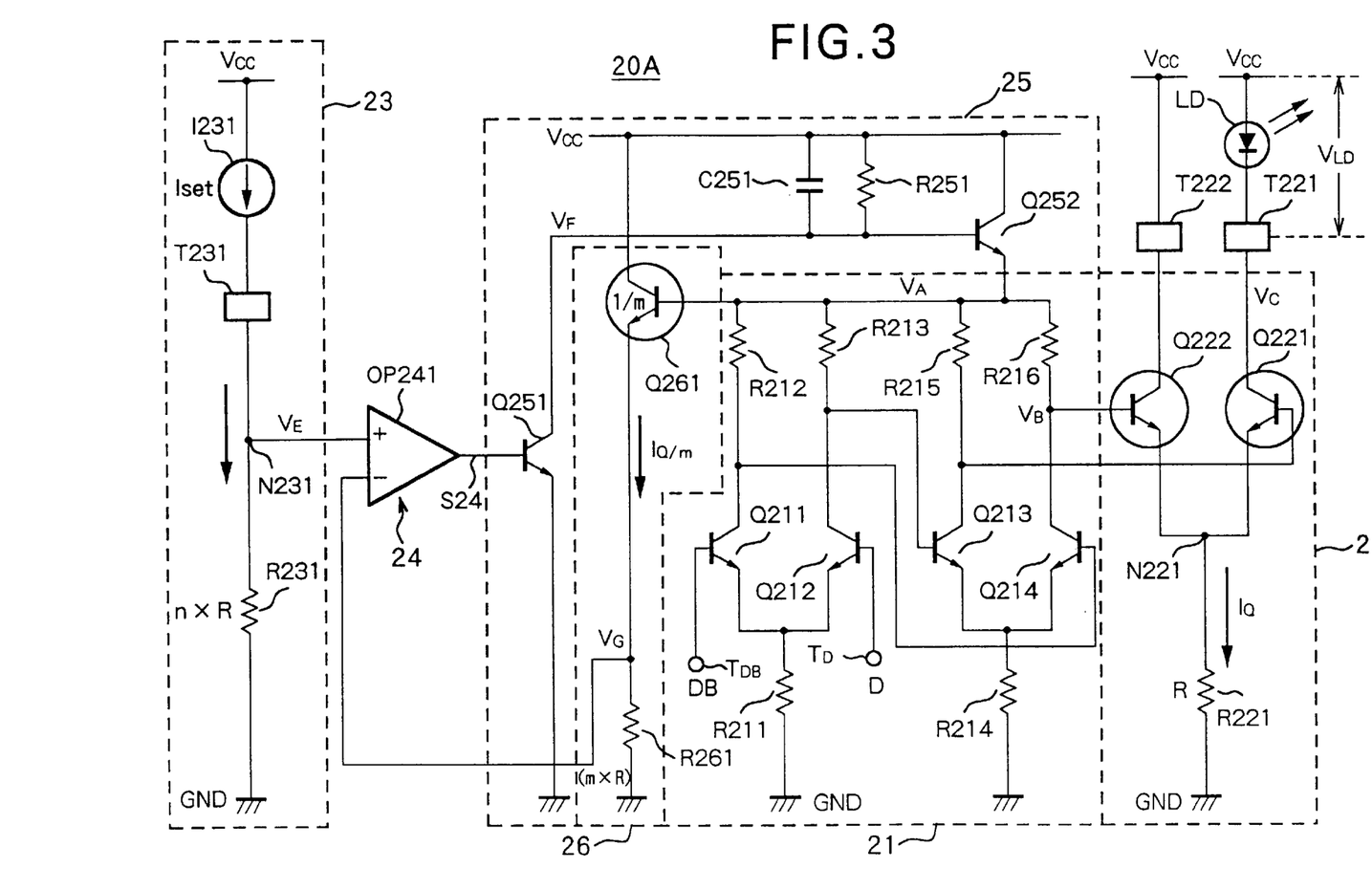
FIG. 3 is a circuit diagram of a second embodiment of a laser diode use drive circuit according to the present invention.

FIG. 3 is a circuit diagram of a second embodiment of a laser diode use drive circuit according to the present invention.

The difference of the present second embodiment from the first embodiment resides in that, as the voltage to be compared with the reference voltage VE at the comparison circuit 24, in place of directly using the voltage VD of the emitter-connection portion N221 of the differential output circuit 22, provision is made of a dummy circuit 26 comprising an npn type transistor Q261 equivalent to the drive transistor Q221 of the differential output circuit 22 and a resistor R261 connected between the emitter of the transistor Q261 and the ground GND and in which the base of the transistor Q261 is connected to the voltage supply line of the variable voltage supply circuit 25 and the emitter side voltage VG of the transistor Q261 is used as the comparison voltage.

Since the voltage VD of the emitter-connection portion N221 of the differential output circuit 22 dynamically changes and therefore there is a possibility of occurrence of offset at the point of voltage comparison by the operational amplifier OP241, this becomes a circuit configuration preventing occurrence of an offset.

Note that the size (emitter size) of the transistor Q261 in the dummy circuit 26 is set to 1/m of the transistors Q221 and Q222 of the differential circuit 22, and the resistance value of the resistor R261 is set to m×R, i.e., m times the resistance value R of the resistor R221.

Accordingly, when the modulation current of the differential output circuit 22 is defined as IQ, the current flowing in the dummy circuit 26 is controlled so that the current of 1/m of IQ flows and the voltage VG becomes (IQ/m)×m×R, that is, IQ×R. This voltage IQ×R is equal to the voltage VD of the emitter-connection portion N221 of the differential output circuit 22.

Next, an explanation will be made of the operation of the present second embodiment.

In the initial state, in the reference voltage generation circuit 23, a reference voltage such as VE (=Iset×(n×R)) is generated and supplied to the comparison circuit 24, and a drive voltage such as VA is supplied from the variable voltage supply circuit 25 to the input circuit 21 and the dummy circuit 26.

In this state, when drive signals D and DB are supplied to the input circuit 21 at a high level (H) and a low level (L), respectively, the current flowing in the transistor Q212 side is increased (transistor Q212 becomes ON state), and the current flowing in the transistor Q211 side is reduced (transistor Q211 becomes OFF state).

As a result, the collector current of the transistor Q212 is increased, the transistor Q213 constituting the differential amplifier circuit of the latter stage becomes the OFF state, and the input signal receiving the amplification action is supplied to the base of the transistor Q221 of the differential output circuit 22 as the differential signal S21 of the level VB.

At this time, the transistor Q214 constituting the differential amplifier circuit of the latter stage of the input circuit 21 is held in the ON state, and the differential signal S21B is supplied at a low level to the base of the transistor Q222 of the differential output circuit 22.

By this, the current flowing in the transistor Q221 of the differential output circuit 22 is increased (transistor Q221 becomes ON state), and the current flowing in the transistor Q222 side is reduced (transistor Q222 becomes OFF state).

As a result, the laser diode LD emits light.

At this time, a current such as substantially IQ/m flows in the emitter side of the transistor Q261 of the dummy circuit 26. Accordingly, the voltage VG of the emitter side becomes substantially IQ/m×m×R (=IQ×R). This voltage VG is supplied (fed back) to the non-inverted input (+) of the operational amplifier OP241 as the comparison circuit 24.

In the comparison circuit 24, the emitter side voltage VG of the dummy circuit 26 and the reference voltage VE generated at the reference voltage generation circuit 23 are compared, and a signal S24 of a level in accordance with the comparison result is output to the variable voltage supply circuit 25.

Specifically, when the emitter side voltage VG of the dummy circuit 26 is larger than the reference voltage VE, the level of the signal S24 is raised, while when it is smaller than the latter, the level of the signal S24 is lowered before output.

In the variable voltage supply circuit 25, the amount of the current flowing in the transistor Q251 is adjusted in accordance with the level of the input signal S24, and a voltage VF determined by this variable current and the resistance value of the resistor R251 is generated.

Then, this voltage VF is supplied to the input circuit 21 and the dummy circuit 26 as the drive voltage VA through the transistor Q252. In actuality, the supply voltage becomes the voltage reduced from the voltage VF by an amount of the forward direction bias Vf of the transistor Q252 (VF–Vf).

Accordingly, levels of the differential signals S21 and S21B supplied from the input circuit 21 to the differential output circuit 22 are adjusted so that the level of the emitter side voltage VG of the dummy circuit 26 equal to the voltage VD of the emitter-connection portion N221 of the differential output circuit 22 becomes low when it is larger than the reference voltage VE, in other words, controlled so that the modulation current flowing in the differential output circuit 22 converges to IQ(n×Iset).

Conversely, when the level of the emitter side voltage VG of the dummy circuit 26 is smaller than the reference voltage VE, the adjustment is carried out so that the levels of the differential signals S21 and S21B supplied from the input circuit 21 to the differential output circuit 22 become high and similarly feedback control is carried out so that the modulation current flowing in the differential output circuit 22 converges to IQ(n×Iset).

On the other hand, when drive signals D and DB are supplied to the input circuit 21 at a low level (L) and a high level (H), respectively, the current flowing in the transistor Q211 side is increased (transistor Q211 becomes ON state), and the current flowing in the transistor Q212 side is reduced (transistor Q212 becomes OFF state).

As a result, the collector current of the transistor Q211 is increased, the transistor Q214 constituting the differential amplifier circuit of the latter stage becomes the OFF state, and the input signal receiving the amplification action is supplied to the base of the transistor Q222 of the differential output circuit 22 as the differential signal S21B of the level VB.

At this time, the transistor Q213 constituting the differential amplifier circuit of the latter stage of the input circuit 21 is held in the ON state, and the differential signal S21 is supplied to the base of the transistor Q221 of the differential output circuit 22 at a low level.

By this, the current flowing in the transistor Q222 of the differential output circuit 22 is increased (transistor Q222 becomes ON state), and the current flowing in the transistor Q221 side is reduced (transistor Q221 becomes OFF state).

As a result, the laser diode LD does not emit light.

Also in this case, feedback control of the modulation current is carried out as mentioned above.

As explained above, according to the present second embodiment, in addition to the effect of the first embodiment mentioned above, there is an advantage that a current setting ratio stabler and higher in precision with respect to variations of the process, temperature change, and fluctuations in the power supply can be secured.

Third Embodiment

Figure 4:
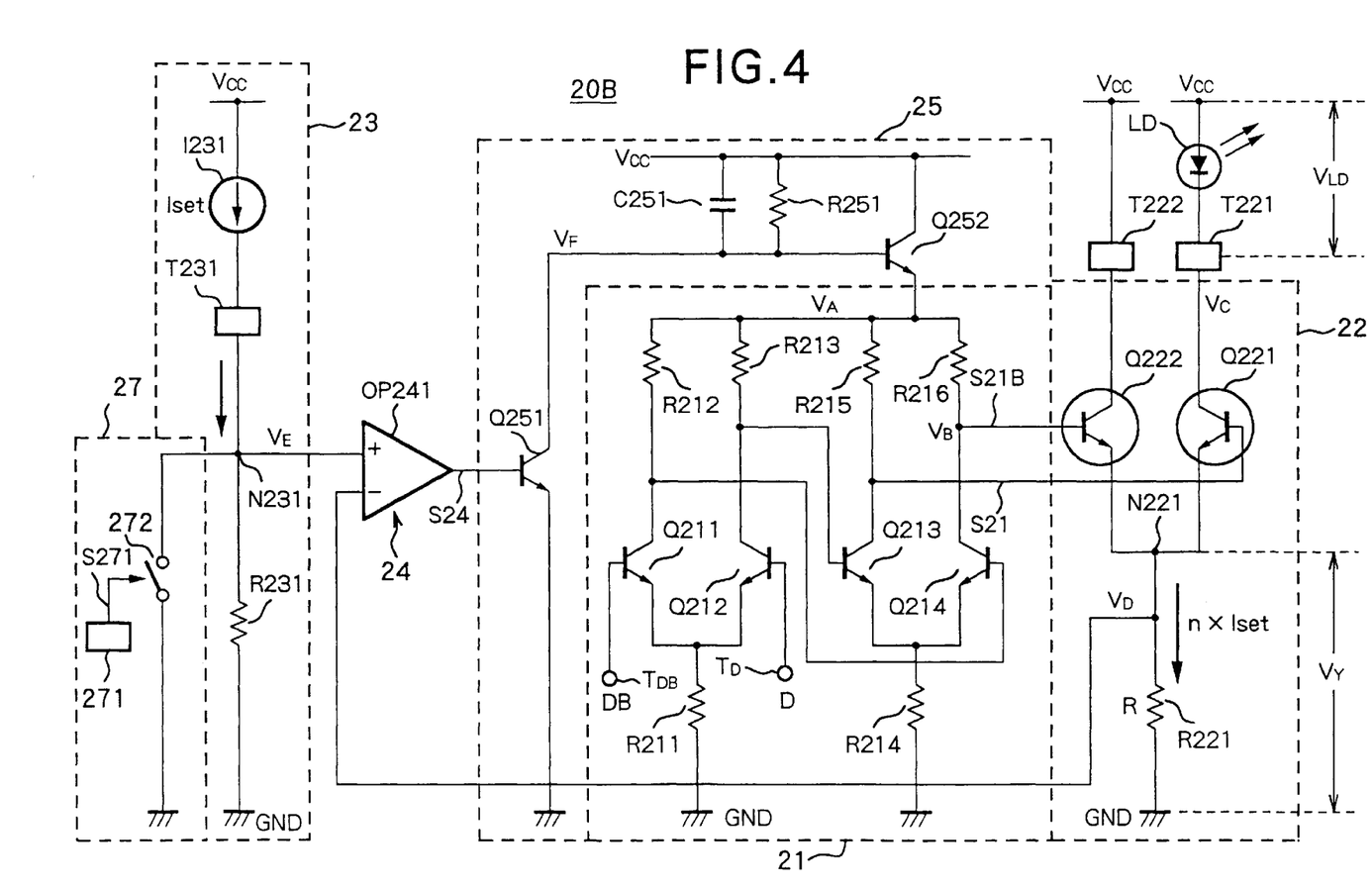
FIG. 4 is a circuit diagram of a third embodiment of a laser diode use drive circuit according to the present invention.

FIG. 4 is a circuit diagram of a third embodiment of a laser diode use drive circuit according to the present invention.

The difference of the present third embodiment from the first embodiment resides in that provision is made of a shut down circuit 27 for making the emission of light (oscillation) of the laser diode LD forcibly stop in a case where for example the present drive circuit is applied to optical communications and an end face of an optical fiber serving as the path of propagation of the optical signal is arranged facing the face of a laser diode LD emitting the light (light firing) using a connector or the like, but the connection between the optical fiber and the light emitting (light firing) face of the laser diode LD becomes detached due to some reason or another or in a case of a safety circuit or the like for preventing an excess current from flowing in the laser diode LD, taking into consideration the effect on the human eye or damage to the laser diode LD.

The shut down circuit 27 according to the present third embodiment is constituted by a detection circuit 271 which detects an existence of abnormality of the state of connection of the optical fiber and the light emitting (light firing) face of the laser diode LD and outputs a detection signal S271 when detecting the abnormality and by a switch circuit 272 which connects the voltage output node N231 of the reference voltage generation circuit 23 to the ground line GND by making this bypass the resistor R231 when receiving the detection signal S271.

When an abnormality of the state of connection of the optical fiber and the light emitting (light firing) face of the laser diode LD is detected at the detection circuit 271 of the shut down circuit 27, the detection signal S271 is output to the switch circuit 272.

The switch circuit 272 receiving the detection signal S271 becomes the ON state. As a result, the voltage output node N231 of the reference voltage generation circuit 23 is grounded, the voltage $V_D$ of the emitter-connection portion N221 of the differential output circuit 22 is grounded by feedback control, and the emission of light of the laser diode LD is forcibly stopped.

According to the present third embodiment, in addition to the effect of the first embodiment mentioned above, there is an advantage that the emission of light can be controlled more stably.

Fourth Embodiment

Figure 5:
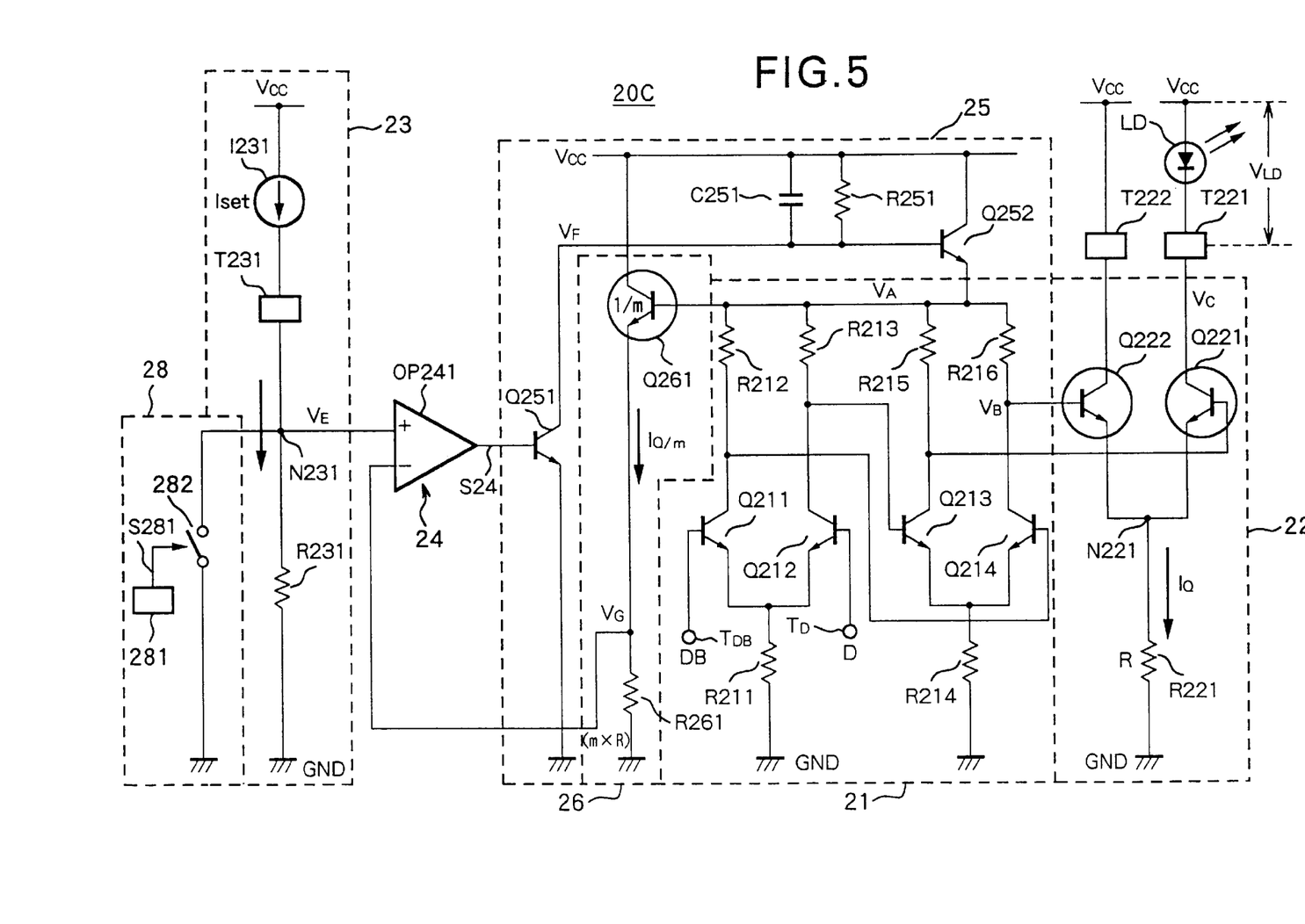
FIG. 5 is a circuit diagram of a fourth embodiment of a laser diode use drive circuit according to the present invention.

FIG. 5 is a circuit diagram of a fourth embodiment of the laser diode use drive circuit according to the present invention.

The difference of the present fourth embodiment from the second embodiment is similar to the relationship between the third embodiment and the first embodiment.

Namely, it resides in that provision is made of a shut down circuit 28 for making the emission of light (oscillation) of the laser diode LD forcibly stop in a case where for example the present drive circuit is applied to optical communications and an end face of an optical fiber serving as the path of propagation of the optical signal is arranged facing the face of a laser diode LD emitting the light (light firing) using a connector or the like, but the connection between the optical fiber and the light emitting (light firing) face of the laser diode LD becomes detached due to some reason or another or in a case of a safety circuit or the like for preventing an excess current from flowing in the laser diode LD, taking into consideration the effect on the human eye or damage to the laser diode LD.

The shut down circuit 28 according to the present fourth embodiment is constituted by a detection circuit 281 which detects an existence of an abnormality of the state of connection of the optical fiber and the light emitting (light firing) face of the laser diode LD and outputs a detection signal S281 when detecting the abnormality and by a switch circuit 282 which connects the voltage output node N231 of the reference voltage generation circuit 23 to the ground line GND by making this bypass the resistor R231 when receiving the detection signal S271.

When an abnormality of the state of connection of the optical fiber and the light emitting (light firing) face of the laser diode LD is detected at the detection circuit 281 of the shut down circuit 28, the detection signal S281 is output to the switch circuit 282.

The switch circuit 282 receiving the detection signal S281 becomes the ON state. As a result, the voltage output node N231 of the reference voltage generation circuit 23 is grounded, the supply of the drive voltage to the input circuit 21 is stopped, and the emission of light of the laser diode LD is forcibly stopped.

According to the present fourth embodiment, in addition to the effect of the second embodiment mentioned above, there is an advantage that the emission of light can be controlled more stably.

Note that, in the first to fourth embodiments, the explanation was made of a circuit using bipolar transistors, but needless to say the present invention can also be applied to insulation gate type or junction type electric field effect transistors.

Further, the explanation was made of by taking as an example a laser diode as the light emitting element, but the configuration is similar and similar effects can be obtained in the case of a drive circuit for an LED as well.

As explained above, according to the present invention, the transistor for the constant current source of the current mirror circuit becomes unnecessary, saturation does not occur even when a large modulation current is set, and the desired constant current (modulation current) can be set while holding the forward direction voltage required by the light emitting element even under a low power supply voltage.

Further, since the light emitting element is driven by a differential circuit of transistors, a stable, high speed operation can be realized.

Further, according to the present invention, since a dummy circuit is provided and feedback control is carried out by comparing the output voltage of this dummy circuit with the reference voltage, a current setting ratio further stabler and higher in precision with respect to variations of the process, temperature changes, and fluctuations in the power supply can be secured.

Further, since a shut down circuit is provided, there is an advantage that the light emission can be controlled more stably.

While the invention has been described with reference to specific embodiment chosen for purpose of illustration, it should be apparent that numerous modifications could be made thereto by those skilled in the art without departing from the basic concept and scope of the invention.

What is claimed is:

1. A drive circuit of a light emitting element comprising:
   a differential output circuit which comprises first and second transistors each having a control terminal and first and second terminals, and the first terminals connected to each other and a current/voltage conversion element connected between a connection point of the first terminals of the first and second transistors and a reference potential, and the second terminal of the second transistor is connected to a power supply voltage source;
   an input circuit which receives differential drive signals and supplies differential signals in accordance with levels of supplied drive voltages to the control terminals of the first and second transistors of the differential output circuit;
   a reference voltage generation circuit which generates a reference voltage;
   a comparison circuit which compares the potential of the connection point of the first terminals of the first and second transistors of the differential output circuit with the reference voltage and outputs a signal of a level in accordance with the result of comparison; and
   a variable voltage supply circuit which generates a voltage in accordance with the level of the output signal of the comparison circuit and supplies the same as the supplied drive voltage to the input circuit.

2. A drive circuit of a light emitting element as set forth in claim 1, wherein the current/voltage conversion element comprises a resistor.

3. A drive circuit of a light emitting element as set forth in claim 2, wherein the reference voltage generation circuit comprises a current source and a resistor connected in series between the power supply voltage source and the reference potential; and the resistance value of this resistor is set to n (note, n is a natural number) times the resistance value R of the resistor serving as the current/voltage conversion element.

4. A drive circuit of a light emitting element as set forth in claim 1, further comprising a shut down circuit for making the emission of light of the light emitting element to forcibly stop.

5. A drive circuit of a light emitting element as set forth in claim 4, wherein the shut down circuit stops the supply of the drive voltage to the input circuit from the variable voltage supply circuit to make the emission of light of the light emitting element to forcibly stop.

6. A drive circuit of a light emitting element, comprising:
   a differential output circuit which comprises first and second transistors each having a control terminal and first and second terminals, and the first terminals connected to each other and a current/voltage conversion element connected between a connection point of the first terminals of the first and second transistors and a reference potential, and the second terminal of the second transistor is connected to a power supply voltage source;
   an input circuit which receives differential drive signals and supplies differential signals in accordance with levels of supplied drive voltages to the control terminals of the first and second transistors of the differential output circuit;
   a reference voltage generation circuit which generates a reference voltage;
   a dummy circuit for generating a comparison voltage having substantially the same value as the potential of the connection point of the first terminals of the first and second transistors of the differential output circuit upon receipt of the supplied drive voltage;
   a comparison circuit which compares the comparison voltage generated by the dummy circuit with the reference voltage and outputs a signal of a level in accordance with the result of comparison; and
   a variable voltage supply circuit which generates a voltage in accordance with the level of the output signal of the comparison circuit and supplies the same as the supplied drive voltage to the input circuit and the dummy circuit.

7. A drive circuit of a light emitting element as set forth in claim 6, wherein the dummy circuit comprises a dummy use transistor which has a control terminal and first and second terminals, and can adjust the amount of the current flowing between the first and second terminals in accordance with the level of the signal supplied to the control terminal, and the supplied drive voltage is supplied to the control terminal and a current/voltage conversion element connected between the first terminal of the dummy use transistor and the reference potential.

8. A drive circuit of a light emitting element as set forth in claim 7, wherein:
   the current/voltage conversion elements of the differential output circuit and the dummy circuit comprise resistors; the resistance value of the resistor of the dummy circuit is set to m (note, m is a natural number) times the resistance value R of the resistor of the differential output circuit; and
   the size of the dummy use transistor of the dummy circuit is set to 1/m of the size of the first transistor of the differential output circuit.

9. A drive circuit of a light emitting element as set forth in claim 8, wherein the reference voltage generation circuit comprises a current source and a resistor connected in series between the power supply voltage source and the reference potential; and the resistance value of this resistor is set to n (note, n is a natural number) times the resistance value R of the resistor serving as the current/voltage conversion element.

10. A drive circuit of a light emitting element as set forth in claim 6, further comprising a shut down circuit for making the emission of light of the light emitting element to forcibly stop.

11. A drive circuit of a light emitting element as set forth in claim 10, wherein the shut down circuit stops the supply of the drive voltage to the input circuit from the variable voltage supply circuit to make the emission of light of the light emitting element to forcibly stop.

12. A drive circuit of a light emitting element comprising:
   a differential output circuit which comprises first and second transistors each having a control terminal and first and second terminals, and can adjust the amounts of current flowing between the first and second terminals in accordance with the level of a signal supplied to the control terminals, and the first terminals connected to each other and which comprises a current/voltage conversion element connected between a connection point of the first terminals of the first and second transistors and a reference potential, and the second terminal of the second transistor is connected to a power supply voltage source;
   an input-circuit which receives differential drive signals and supplies differential signals in accordance with levels of supplied drive voltages to the control terminals of the first and second transistors of the differential output circuit;

a reference voltage generation circuit which generates a reference voltage;

a comparison circuit which compares the potential of the connection point of the first terminals of the first and second transistors of the differential output circuit with the reference voltage and outputs a signal of a level in accordance with the result of comparison; and a variable voltage supply circuit which generates a voltage in accordance with the input level of the output signal of the comparison circuit and supplies the same as the supplied drive voltage to the input circuit.

13. A drive circuit of a light emitting element as set forth in claim 12, wherein the current/voltage conversion element comprises a resistor.

14. A drive circuit of a light emitting element as set forth in claim 13, wherein the reference voltage generation circuit comprises a current source and a resistor connected in series between the power supply voltage source and the reference potential; and the resistance value of this resistor is set to n (note, n is a natural number) times the resistance value R of the resistor serving as the current/voltage conversion element.

15. A drive circuit of a light emitting element as set forth in claim 12, further comprising a shut down circuit for making the emission of light of the light emitting element to forcibly stop.

16. A drive circuit of a light emitting element as set forth in claim 15, wherein the shut down circuit stops the supply of the drive voltage to the input circuit from the variable voltage supply circuit to make the emission of light of the light emitting element to forcibly stop.

17. A drive circuit of a light emitting element, comprising:

a differential output circuit which comprises first and second transistors each having a control terminal and first and second terminals, and can adjust the amounts of current flowing between the first and second terminals in accordance with the level of a signal supplied to the control terminals, and the first terminals connected to each other and which comprises a current/voltage conversion element connected between a connection point of the first terminals of the first and second transistors and a reference potential, and the second terminal of the second transistor is connected to a power supply voltage source;

an input circuit which receives differential drive signals and supplies differential signals in accordance with levels of supplied drive voltages to the control terminals of the first and second transistors of the differential output circuit;

a reference voltage generation circuit which generates a reference voltage;

a dummy circuit for generating a comparison voltage having substantially the same value as the potential of the connection point of the first terminals of the first and second transistors of the differential output circuit upon receipt of the supplied drive voltage;

a comparison circuit which compares the comparison voltage generated by the dummy circuit with the reference voltage and outputs a signal of a level in accordance with the result of comparison; and a variable voltage-supply circuit which generates a voltage in accordance with the level of the output signal of the comparison circuit and supplies the same as the supplied drive voltage to the input circuit and the dummy circuit.

18. A drive circuit of a light emitting element as set forth in claim 17, wherein the dummy circuit comprises a dummy use transistor which has a control terminal and first and second terminals, and can adjust the amount of the current flowing between the first and second terminals in accordance with the level of the signal supplied to the control terminal, and the supplied drive voltage is supplied to the control terminal and a current/voltage conversion element connected between the first terminal of the dummy use transistor and the reference potential.

19. A drive circuit of a light emitting element as set forth in claim 18, wherein:

the current/voltage conversion elements of the differential output circuit and the dummy circuit comprise resistors; the resistance value of the resistor of the dummy circuit is set to m (note, m is a natural number) times the resistance value R of the resistor of the differential output circuit; and the size of the dummy use transistor of the dummy circuit is set to 1/m of the size of the first transistor of the differential output circuit.

20. A drive circuit of a light emitting element as set forth in claim 19, wherein the reference voltage generation circuit comprises a current source and a resistor connected in series between the power supply voltage source and the reference potential; and the resistance value of this resistor is set to n (note, n is a natural number) times the resistance value R of the resistor serving as the current/voltage conversion element.

21. A drive circuit of a light emitting element as set forth in claim 17, further comprising a shut down circuit for making the emission of light of the light emitting element to forcibly stop.

22. A drive circuit of a light emitting element as set forth in claim 21, wherein the shut down circuit stops the supply of the drive voltage to the input circuit from the variable voltage supply circuit to make the emission of light of the light emitting element to forcibly stop.

23. A light emitting apparatus, comprising:

a differential output circuit which comprises first and second transistors each having a control terminal and first and second terminals, and the first terminals connected to each other and a current/voltage conversion element connected between a connection point of the first terminals of the first and second transistors and a reference potential, and the second terminal of the second transistor is connected to a power supply voltage source;

a light emitting element connected between the second terminal of the first transistor and the power supply voltage source;

an input circuit which receives differential drive signals and supplies differential signals in accordance with levels of supplied drive voltages to the control terminals of the first and second transistors of the differential output circuit;

a reference voltage generation circuit which generates a reference voltage;

a comparison circuit which compares the potential of the connection point of the first terminals of the first and second transistors of the differential output circuit with the reference voltage and outputs a signal of a level in accordance with the result of comparison; and a variable voltage supply circuit which generates a voltage in accordance with the level of the output signal of the comparison circuit and supplies the same as the supplied drive voltage to the input circuit.

24. A light emitting apparatus as set forth in claim 23, wherein the current/voltage conversion element comprises a resistor.

25. A light emitting apparatus as set forth in claim 24, wherein the reference voltage generation circuit comprises a current source and a resistor connected in series between the power supply voltage source and the reference potential; and the resistance value of this resistor is set to n (note, n is a natural number) times the resistance value R of the resistor serving as the current/voltage conversion element.

26. A light emitting apparatus as set forth in claim 23, further comprising a shut down circuit for making the emission of light of the light emitting element to forcibly stop.

27. A light emitting apparatus as set forth in claim 26, wherein the shut down circuit stops the supply of the drive voltage to the input circuit from the variable voltage supply circuit to make the emission of light of the light emitting element to forcibly stop.

28. A light emitting apparatus, comprising:
a differential output circuit which comprises first and second transistors each having a control terminal and first and second terminals, and the first terminals connected to each other and a current/voltage conversion element connected between a connection point of the first terminals of the first and second transistors and a reference potential, and the second terminal of the second transistor is connected to a power supply voltage source;
a light emitting element connected between the second terminal of the first transistor and the power supply voltage source,
an input circuit which receives differential drive signals and supplies differential signals in accordance with levels of supplied drive voltages to the control terminals of the first and second transistors of the differential output circuit;
a reference voltage generation circuit which generates a reference voltage;
a dummy circuit for generating a comparison voltage having substantially the same value as the potential of the connection point of the first terminals of the first and second transistors of the differential output circuit upon receipt of the supplied drive voltage;
a comparison circuit which compares the comparison voltage generated by the dummy circuit with the reference voltage and outputs a signal of a level in accordance with the result of comparison; and
a variable voltage supply circuit which generates a voltage in accordance with the level of the output signal of the comparison circuit and supplies the same as the supplied drive voltage to the input circuit and the dummy circuit.

29. A light emitting apparatus as set forth in claim 28, wherein the dummy circuit comprises a dummy use transistor which has a control terminal and first and second terminals, and can adjust the amount of the current flowing between the first and second terminals in accordance with the level of the signal supplied to the control terminal, and the supplied drive voltage is supplied to the control terminal and a current/voltage conversion element connected between the first terminal of the dummy use transistor and the reference potential.

30. A light emitting apparatus as set forth in claim 29, wherein:

the current/voltage conversion elements of the differential output circuit and the dummy circuit comprise resistors; the resistance value of the resistor of the dummy circuit is set to m (note, m is a natural number) times the resistance value R of the resistor of the differential output circuit: and the size of the dummy use transistor of the dummy circuit is set to 1/m of the size of the first transistor of the differential output circuit.

31. A light emitting apparatus as set forth in claim 30, wherein the reference voltage generation circuit comprises a current source and a resistor connected in series between the power supply voltage source and the reference potential; and the resistance value of this resistor is set to n (note, n is a natural number) times the resistance value R of the resistor serving as the current/voltage conversion element.

32. A light emitting apparatus as set forth in claim 28, further comprising a shut down circuit for making the emission of light of the light emitting element to forcibly stop.

33. A light emitting apparatus as set forth in claim 32, wherein the shut down circuit stops the supply of the drive voltage to the input circuit from the variable voltage supply circuit to make the emission of light of the light emitting element to forcibly stop.

34. A light emitting apparatus comprising:
a differential output circuit which comprising first and second transistor each having a control terminal and first and second terminals, and can adjust the amounts of current flowing between the first and second terminals in accordance with the level of a signal supplied to the control terminals, and the first terminals connected to each other and which comprises a current/voltage conversion element connected between a connection point of the first terminals of the first and second transistors and a reference potential, and the second current input/output terminal of the second transistor is connected to a power supply voltage source;
a light emitting element connected between the second terminal of the first transistor and the power supply voltage source;
an input circuit which receives differential drive signals and supplies differential signals in accordance with levels of supplied drive voltages to the control terminals of the first and second transistors of the differential output circuit;
a reference voltage generation circuit which generates a reference voltage;
a comparison circuit which compares the potential of the connection point of the first terminals of the first and second transistors of the differential output circuit with the reference voltage and outputs a signal of a level in accordance with the result of comparison; and
a variable voltage supply circuit which generates a voltage in accordance with the input level of the output signal of the comparison circuit and supplies the same as the supplied drive voltage to the input circuit.

35. A light emitting apparatus as set forth in claim 34, wherein the current/voltage conversion element comprises a resistor.

36. A light emitting apparatus as set forth in claim 35, wherein the reference voltage generation circuit comprises a current source and a resistor connected in series between the power supply voltage source and the reference potential; and the resistance value of this resistor is set to n (note, n is a natural number) times the resistance value R of the resistor serving as the current/voltage conversion element.

37. A light emitting apparatus as set forth in claim 34, further comprising a shut down circuit for making the emission of light of the light emitting elements to forcibly stop.

38. A light emitting apparatus as set forth in claim 37, wherein the shut down circuit stops the supply of the drive voltage to the input circuit from the variable voltage supply circuit to make the emission of light of the light emitting element to forcibly stop.

39. A light emitting apparatus, comprising:

a differential output circuit which comprises first and second transistors each having a control terminal and first and second terminals, and can adjust the amounts of current flowing between the first and second terminals in accordance with the level of a signal supplied to the control terminals, and the first terminals connected to each other and which comprises a current/voltage conversion element connected between a connection point of the first terminals of the first and second transistors and a reference potential, and the second terminal of the second transistor is connected to a power supply voltage source;

a light emitting element connected between the second terminal of the first transistor and the power supply voltage;

an input circuit which receives differential drive signals and supplies differential signals in accordance with levels of supplied drive voltages to the control terminals of the first and second transistors of the differential output circuit;

a reference voltage generation circuit which generates a reference voltage;

a dummy circuit for generating a comparison voltage having substantially the same value as the potential of the connection point of the first terminals of the first and second transistors of the differential output circuit upon receipt of the supplied drive voltage;

a comparison circuit which compares the comparison voltage generated by the dummy circuit with the reference voltage and outputs a signal of a level in accordance with the result of comparison; and a variable voltage supply circuit which generates a voltage in accordance with the level of the output signal of the comparison circuit and supplies the same as the supplied drive voltage to the input circuit and the dummy circuit.

40. A light emitting apparatus as set forth in claim 39, wherein the dummy circuit comprises a dummy use transistor which has a control terminal and first and second terminals, and can adjust the amount of the current flowing between the first and second terminals in accordance with the level of the signal supplied to the control terminal, and the supplied drive voltage is supplied to the control terminal and a current/voltage conversion element connected between the first terminal of the dummy use transistor and the reference potential.

41. A light emitting apparatus as set forth in claim 40, wherein:

the current/voltage conversion elements of the differential output circuit and the dummy circuit comprise resistors; the resistance value of the resistor of the dummy circuit is set to m (note, m is a natural number) times the resistance value R of the resistor of the differential output circuit; and the size of the dummy use transistor of the dummy circuit is set to 1/m of the size of the first transistor of the differential output circuit.

42. A light emitting apparatus as set forth in claim 41, wherein the reference voltage generation circuit comprises a current source and a resistor connected in series between the power supply voltage source and the reference potential; and the resistance value of this resistor is set to n (note, n is a natural number) times the resistance value R of the resistor serving as the current/voltage conversion element.

43. A light emitting apparatus as set forth in claim 39, further comprising a shut down circuit for making the emission of light of the light emitting element to forcibly stop.

44. A light emitting apparatus as set forth in claim 43, wherein the shut down circuit stops the supply of the drive voltage to the input circuit from the variable voltage supply circuit to make the emission of light of the light emitting element to forcibly stop.

* * * * *